(12) United States Patent
Bixel

(10) Patent No.: US 6,205,042 B1
(45) Date of Patent: Mar. 20, 2001

(54) INDIRECT CALCULATION OF BUS VOLTAGE FOR VOLTAGE SOURCE INVERTER

(75) Inventor: Paul S. Bixel, Salem, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/427,585

(22) Filed: Oct. 27, 1999

(51) Int. Cl.[7] .................................................. H02M 3/24
(52) U.S. Cl. ......................................................... 363/95
(58) Field of Search ................................. 363/71, 95, 97, 363/131; 318/798, 801, 803, 805, 806

(56) References Cited

U.S. PATENT DOCUMENTS

| | | | |
|---|---|---|---|
| 4,521,840 | 6/1985 | Hoadley | 363/35 |
| 4,843,533 | * 6/1989 | Roof et al. | 363/55 |
| 5,280,421 | * 1/1994 | De Doncker et al. | 363/89 |
| 5,625,545 | 4/1997 | Hammond | 363/71 |
| 5,642,275 | 6/1997 | Peng et al. | 363/137 |
| 5,883,796 | 3/1999 | Cheng et al. | 363/40 |
| 6,011,377 | * 1/2000 | Heglund et al. | 318/701 |
| 6,031,738 | * 2/2000 | Lipo et al. | 363/37 |

* cited by examiner

Primary Examiner—Matthew Nguyen
(74) Attorney, Agent, or Firm—Carl B. Horton; Thomas M. Blasey; Hunton & Williams

(57) ABSTRACT

A method and apparatus for determining accurate stored energy values and effective DC bus voltage values for a voltage source inverter. The technique includes the determination of an effective DC bus voltage for the VSI based on an output voltage and the modulation index of the VSI. Further, an estimated power flow can be integrated to obtain an estimated stored energy, which can then be used to determine the effective DC bus voltage of the VSI. The disclosed technique is accurate in both transient and steady-state conditions, and reduces the effects of long term error accumulation.

35 Claims, 3 Drawing Sheets

```
Cap_Mtr_Pwr = Vab*Ia - Vbc*Ic;
   Brg_Losses = (Vdc_Fbk2 * EE.Cl.Bus_Res_Rcp);
Vdc_VMag2 = 2.0/3.0*(SQR(Vab)+SQR(Vbc) + Vab*Vbc);
   Vdc_VMag = sqrt(Vdc_VMag2); /
   Vdc_Rect = Vdc_Line = Vdc_Line +
300*Del_Tm_1*(Ac_Line_Mag*EE.Cl.Xfmr_Ratio-Vdc_Line);
   if (Ram_Dig_Stat.Pwr_Elec_Enb) { if (U_Sqr_Fil > SQR(EE.Cl.Vdc_MI_Thrs))
{Vdc_MI2 = Vdc_MI2 + 15.0 * Del_Tm_1*((2.0*Vdc_VMag2/U_Sqr_Fil) +
EE.Cl.Vdc_IGBT2 - Vdc_MI2);
Vdc_MI = sqrt(Vdc_MI2);
      Vdc_Rect = MIN(Vdc_Line,Vdc_MI);}
else {Vdc_MI2 = Vdc_Fbk2;
      Vdc_MI = Vdc_Fbk;}
Vdc_Err_Pwr = 0.5 * EE.Cl.Bus_Cap * (Vdc_Fbk2 - Vdc_MI2) *
Del_Tm_1_Rcp;
if (EE.Cl.Rgn_Disable) Brg_Losses = 0;
      else if(Vdc_Err_Pwr > 3 * Brg_Losses) Brg_Losses *= 3;
      else if(-Vdc_Err_Pwr > Brg_Losses) Brg_Losses = 0;
      else Brg_Losses += Vdc_Err_Pwr;} else
{Vdc_MI2 = Vdc_Fbk2; Vdc_MI = Vdc_Fbk;}
Cap_Power = -Cap_Mtr_Pwr - Brg_Losses;
Cap_Energy = Cap_Energy + Cap_Power * Del_Tm_1;
if(Fbks_Invalid) {Cap_Energy = 0;Vdc_Rect = 0;}
Cap_NRG_Min = EE.Cl.Bus_Cap * 0.5 * SQR(Vdc_Rect);
   LimitHiLo(Cap_Energy,EE.Cl.Cap_NRG_Max,Cap_NRG_Min);
Vdc_Fbk2 = Cap_Energy * 2 / EE.Cl.Bus_Cap;
   Vdc_Fbk = Vdc = sqrt(Vdc_Fbk2);
```

INDIRECT CALCULATION OF BUS VOLTAGE FOR VOLTAGE SOURCE INVERTER

BACKGROUND OF THE INVENTION

The present invention relates generally to voltage source inverters, such as are used in motor drive applications. More particularly, the present invention relates to a method and apparatus for determining an effective DC bus voltage present within a voltage source inverter.

Voltage source inverters (VSIs) are commonly used in motor drives and other applications to control the magnitude and frequencies of voltages in these systems. It is generally desirable to be able to obtain an accurate measure of the effective DC bus voltage present within a VSI, as such a measure is useful for monitoring, control, and to obtain optimal VSI performance in different operating conditions. However, a wide variety of VSI's are known, many of which have designs or bridge topologies which make it difficult to directly measure the effective DC bus voltage. For example, multi-level VSI bridges are known which contain multiple internal DC buses. Conventionally, such bridges require multiple voltage sensors for direct measurements of the bus voltages. This solution is impractical because it typically requires high cost sensors in order to achieve a relatively high level of voltage isolation, and because the use of multiple sensors places a significant I/O burden on the control circuitry associated with the VSI.

In view of the limitations of the techniques described above, it would be desirable to be able to determine the effective DC bus voltage present within a VSI without the need for direct bus voltage measurement. It would further be desirable to be able to determine the effective DC bus voltage of the VSI regardless of the topology of the VSI bridge. It would also be desirable to accurately determine effective DC bus voltage in both transient and steady state conditions.

BRIEF SUMMARY OF THE INVENTION

The problems and limitations described above are overcome, and additional advantages can be achieved, according to the exemplary embodiments of the present invention described below, which provide a technique for accurately determining a DC bus voltage in a VSI independent of bridge topology and in both transient and steady state conditions. The exemplary embodiments use variables readily available within the VSI to accurately determine the effective DC bus voltage. In one example, effective DC bus voltage is determined by measuring a first output voltage of the VSI and dividing the first output voltage by a modulation index of the VSI to determine a first effective DC voltage signal. In another example, the effective DC voltage can be determined from a stored energy and an effective capacitance of the VSI. In still another example, the techniques can be combined.

BRIEF DESCRIPTION OF THE DRAWINGS

The present invention and its features and advantages can be better understood by reading the following Detailed Description of exemplary embodiments in conjunction with the accompanying drawings, in which like reference indicia indicate like elements, and in which:

FIG. 5 is a source code listing describing one specific software implementation of the present invention.

DETAILED DESCRIPTION OF THE INVENTION

Figure 1:
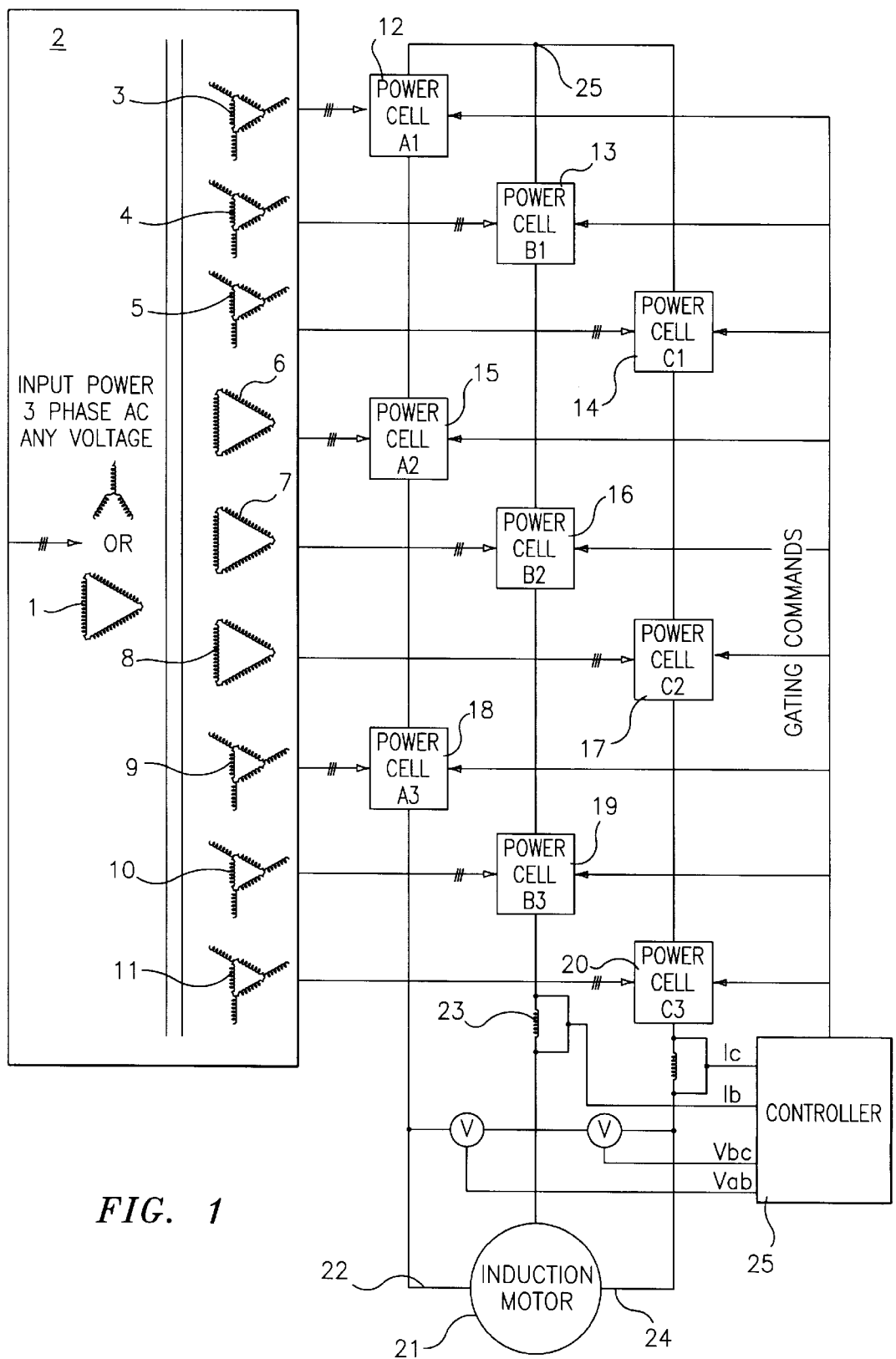
FIG. 1 is a block diagram of one type of voltage source inverter (VSI) in which the present invention can be implemented.

FIG. 1 is a diagram of an embodiment of voltage source inverter in which the technique of the present invention can be advantageously implemented. It will be appreciated that the embodiment of FIG. 1 represents merely one VSI topology, and that the technique of the present invention is widely applicable to a variety of VSI topologies.

It should be noted for purposes of the explanation of FIG. 1, a star-type configuration is one in which each phase shares a common node or connection, with every other phase, and may be composed of an arbitrary number of phases. In a three-phase circuit, such a star configuration may be referred to as a WYE connection. A zig-zag transformer may be considered as a special case of a star-configured transformer. In contrast, a mesh-type configuration is one in which two respective phases are connected by a respective impedance, any may be composed of an arbitrary number of phases. In a three-phase circuit, such may be referred to as a DELTA configuration. An extended-delta transformer may be considered as a special case of a mesh-configured transformer. Although the embodiments herein are described in terms of three-phase power circuits, the invention may be applied to other multi-phase circuit configurations, e.g., six phase, as well. It will be appreciated that the embodiment of FIG. 1 uses mesh-connected secondary windings. For purposes of explanation, it is assumed that the embodiment of FIG. 1 is configured for a 2300 VAC induction motor load.

As shown in FIG. 1, three-phase AC input power is supplied to primary winding circuit 1 of power supply transformer 2. Primary winding circuit 1, which may be star- or mesh-connected, energizes three-phase secondary winding circuits 3 through 11. The three-phase power associated with each of secondary winding circuits 3 through 11 is supplied to power cells 12 through 20, respectively. The mesh-connected secondary winding circuits, which may include, for example, delta or extended delta configurations, 3 through 11 function to lower the supply transformer's K-factor and to improve harmonics control. Under certain circumstances, such mesh windings may be manipulated to advance some of the secondary windings by preselected degrees of electrical phase, to retard other secondary windings by preselected degrees of electrical phase, and, perhaps, to leave other secondary windings substantially unshifted in phase.

Figure 4:
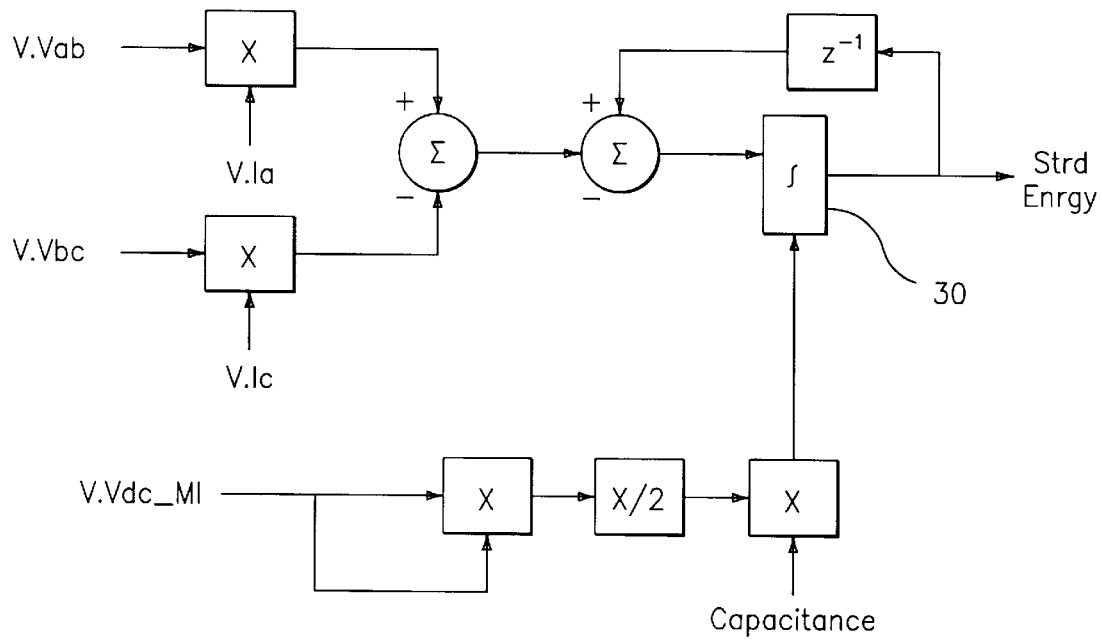
FIG. 4 is a diagram of a portion of a technique in accordance with the present invention which can be used in conjunction with the technique of FIG. 2.

In the embodiment shown in FIG. 1, it is preferred that one-third of the secondary winding circuits be advanced in phase by 20.degree. and that one-third of the secondary winding circuits be delayed in phase by 20.degree. The remaining third of the secondary winding circuits remain unshifted. In the embodiment of FIG. 4, the phase-shifted windings use extended-delta-configured windings, and the unshifted windings use delta-configured windings. For other voltages, the desired phase shift can be obtained by dividing 60.degrees by the number of cells per phase. For example, with 5 cells per phase, the shifts are +24.degrees, +12.degrees, 0.degrees, −12.degrees and −24.degrees.

It is preferred to connect multiple power cells to each of phase output lines 22, 23, 24, which can represent phase A, Phase B and Phase C, respectively. Multiple cells can be connected in series on each phase output line, making it possible to produce a medium-voltage input phase line controller with a plurality of low-voltage power cells. Serial connections also make multiple voltage states per phase possible; these multiple voltage states per phase may be used to obtain improved current waveforms. Each power cell may be constructed internally to low-voltage standards, for example, each power cell may have a 600-volts rating, despite its inclusion in a medium-voltage apparatus. In such an embodiment, the individual power cells may be isolated from ground, and other power cells, using insulation suitable for the medium voltage level being used.

In the embodiment of FIG. 1, phase output line 22 is serially connected with power cells 12, 15, 18. Likewise, phase output line 23 is serially connected with power cells 13, 16, 19. Similarly, phase output line 24 is serially connected with power cells 14, 17, 20. In the present embodiment, it is preferred that the cells feeding branches 22, 23, 24 are joined by a WYE connection 25 with a floating neutral. Thus configured, power cells 12 through 20 can impress a sufficient medium-voltage line-to-line voltage on motor 21, even though power cells 12 through 20 themselves are constructed internally of components rated to low-voltage standards.

In the embodiment of FIG. 1, each of secondary winding circuits 3 through 11 provide isolated three-phase power at 460 volts AC (VAC) to power cells 12 through 20, respectively. Further, a controller 125 is provided and is suitably connected to provide gating commands to each of the power cells 12 through 20. Accordingly, the smoothing filter inside each cell will be charged to about 600 volts DC (VDC). Thus, the maximum voltage that can be output by each of power cells 12 through 20 is about 600 VDC. Depending on which transistors are on, the output voltage may be of either polarity or zero. Thus, each of power cells 12 through 20 can have three output states: +600 VDC, −600 VDC, or ZERO VDC.

In the embodiment of FIG. 1, it will be noticed that three power cells per phase output line are provided. Due to the serial connection between three of the power cells in each phase output line, such as, for example, power cells 12, 15, 18 in phase output line 22, it is possible to produce a maximum output voltage magnitude of about 1800 VDC above neutral. Each power cell may be operated independently of another. Therefore, it is possible to provide at least seven voltage levels per phase to AC motor 21 which, for one presently preferred embodiment, may have a voltage requirement of up to 2300 VAC. The approximate values of those voltage states include +/−1800 VDC, +/−1200 VDC, +/−600 VDC and ZERO VDC.

In other embodiments, circuits using greater or fewer than three power cells per phase may be used to satisfy the voltage requirements of the inductive motor load. For example, in one presently preferred embodiment which can be applied to 2300 VAC inductive motor loads, three power cells are used for each of the three phase output lines. However, in another presently preferred embodiment, which may be applied to a 4160 VAC inductive motor load, five power cells may be used for each of the three phase output lines. Such an embodiment can have eleven (11) voltage states which may include approximately +/−3000 VDC, +/−2400 VDC, +/−1800 VDC, +/−1200 VDC, +/−600 VDC and ZERO VDC.

To enhance the performance of the controller 125, it is desirable to determine an effective DC bus voltage value; that is, a value indicative of the aggregate voltage present in the power cells 12–20. While there are a variety of DC bus voltage calculations that can be determined, one such calculation is given by multiplying the average voltage (measured in cells per phase) by twice the total number of cells. In the example above, using three cells per phase, this effective DC bus voltage value is ⅔ the total voltage across all of the power cells. It will be appreciated that other formulae can provide a useful measure of effective DC bus voltage for the controller 125.

Rather than having sensors provided for directly measuring voltage in each cell, one implementation of the present invention contemplates measuring two output voltages of the VSI, namely voltages Vab and Vbc from connections 26 to the controller 125. Further, this same implementation contemplates providing coils 27 and 28 for measuring VSI output currents Ic and Ib. These values, Vbc, Vab, Ib and Ic are provided as inputs to the controller 125. According to the same implementation of the present invention, a total effective capacitance value is determined for the power cells, each of which has a predeterminable capacitance value. Again, while many useful capacitance values can be determined, one exemplary formula is given by multiplying the total cell capacitance by 0.75, and dividing the product by the total number of cells.

Based on the VSI output voltages and current, and on a total effective capacitance value, the total effective DC bus voltage can be determined.

Figure 2:
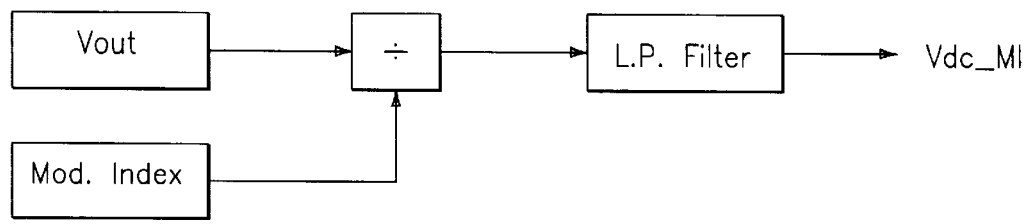
FIG. 2 is a diagram of a first aspect of a technique for determining an effective DC bus voltage in a voltage source inverter.

Referring now to FIG. 2, a block diagram showing one aspect of an exemplary technique of the present invention is shown. In this technique, the relationship between the effective DC bus voltage (Vdc), modulation index (MI) of the VSI, and the magnitude of the output voltage of the VSI (Vout) is presumed to be Vout/MI=Vdc. It will be understood that the modulation index is a per unit measure of the output voltage reference being sent to the modulator or processor controlling the VSI. In the example of FIG. 2, the output voltage Vout is provided as an input to a processing circuit 10 (e.g., a voltage divider), which divides the output voltage by the modulation index of the VSI to generate a divided voltage signal. The divided voltage signal is input to a low pass filter 12 to generate an approximation of the effective DC bus voltage (Vdc_MI). The low pass filter 12 reduces high frequency components in the modulation index. The technique of FIG. 2 can be used as the sole technique to determine DC bus voltage of the VSI, and provides relatively accurate results in steady state conditions. However, the required filtering reduces the effectiveness of this technique in transient conditions. FIG. 2 can alternatively be implemented using a predetermined linearization curve, implemented by suitable processing circuitry (not shown) to compensate for effects of any non-linear relationships between the modulation index, the output voltage, and the effective DC bus voltage.

Figure 3:
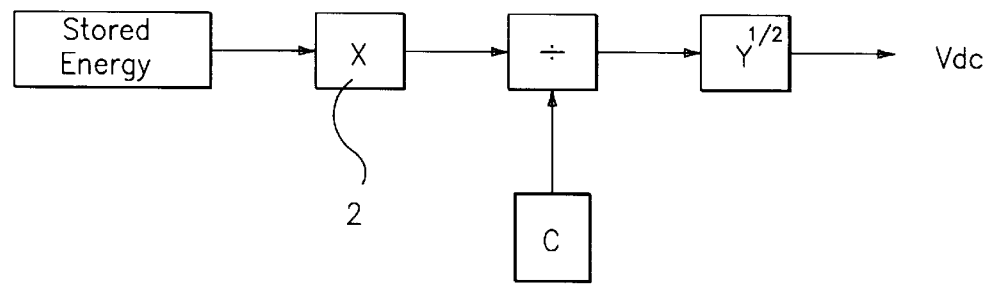
FIG. 3 is a diagram of a second aspect of a technique for determining an effective DC bus voltage in a voltage source inverter.

Referring now to FIG. 3, a second aspect of an exemplary technique of the present invention is shown. In this technique, the relationship between the effective capacitance in the VSI and the stored energy is used to compute the DC bus voltage. Specifically, the technique presumes that Vdc is equal to the square root of 2 times the stored energy divided by the capacitance (i.e., Vdc=Sqrt (2*Energy/C). As implemented in FIG. 3, the stored energy is determined (e.g., from an appropriately placed sensor or calculated by a processor) is provided to a multiplier/amplifier circuit where it is amplified (e.g., multiplied by a factor of 2). The amplified stored energy value is then divided (e.g., in a processor or by a suitable dividing circuit) by the capacitance to generate a square of the DC bus voltage. The square root of the divided value is then determined to approximate the DC bus voltage. It should be noted that the technique of FIG. 3 is accurate over a relatively short period of time, but can become less accurate over time due to error accumulation (for example, due to uncertainties in the energy flow in the VSI, and due to the manufacturing tolerances of the capacitors).

Referring now to FIG. 4, a block diagram of a portion of a technique is accordance with the present invention, and which can be used in conjunction with the technique of FIG. 2 is shown. In the technique of FIG. 4, a rough estimate of power flow in the bridge is derived from output voltages and currents in the VSI, and this estimated power flow is integrated to determine the stored energy in the bridge. The stored energy determined in this manner can then be provided as the stored energy value in FIG. 3, and used to determine the DC bus voltage. The noted disadvantage of the FIG. 3 technique, that is, the long term error accumulation, is prevented in the technique of FIG. 4 by providing an energy clamp having a clamping value derived from the filtered and accurate bus voltage value (e.g., using the technique of FIG. 1). The technique of FIG. 4 thus provides accurate determination of effective DC bus voltage in both steady state and transient conditions, over a long term.

More particularly, in the technique of FIG. 4, the output voltages Vab and Vbc from different bus lines are multiplied (e.g., in a processor) by output current values Ia and Ic, respectively, to generate first and second power signals, respectively. The second power signal (Vbc*Ic) is subtracted from the first power signal (Vab*Ia) to generate an estimated power flow value Vab*Ia−Vbc*Ic. This estimated power flow value is summed with a feedback value (to be explained below) and the summed value is filtered in a band pass filter 30. The filter 30 uses a maximum energy value as an upper limit, and uses a clamping value, which will now be described, as a lower limit.

The clamping value is derived using the technique of FIG. 2 to determine an estimated effective DC bus voltage Vdc__MI from the filtered combination of a VSI output voltage and the modulation index of the VSI. This value is squared in a multiplier 32 (which may be implemented by a processor), and the squared value is reduced by 50% in a multiplier 34. The reduced squared value is then multiplied by the effective capacitance of the VSI to determine the clamping value used as the lower limit for the filtering operation of the filter 30.

The filtered value output by the filter 30 is both provided as an output stored energy value and is also integrated in an integrator 36 in a feedback loop to generate a feedback value. The feedback value is summed as described above with the estimated power flow value (Vab*Ia−Vbc*Ic) for input to the filter 30.

It should be appreciated that the output stored energy value output by the integrator 30 represents a stored energy value which is not subject to the long term error accumulation of the technique of FIG. 3. Thus, the stored energy value output by the filter 30 can then be applied as the estimated stored energy value in the technique of FIG. 3 to generate an estimated effective DC bus voltage for the VSI which is accurate in both steady state and transient conditions, and which is not subject to long term error accumulation Referring now to FIG. 5, a source code listing of a specific software implementation of the present invention is shown. The source code listing of FIG. 5 is copyrighted material of the General Electric Company, and all rights are reserved. The software implementation of FIG. 5 can reside in a processor connected to receive the inputs described above with respect to the technique of FIG. 4. In the implementation of FIG. 5, since there is no direct feedback provided on the DC bus voltage, the value Vdc is modeled by predicting the energy in the capacitor of the VSI.

The many specific details in the above description have been provided for purposes of illustration only, and are not limitations of the invention. The examples presented above can be readily modified in a wide variety of ways yet still remain within the scope of the invention, as is defined by the following claims and their legal equivalents.

What is claimed is:

1. A method for providing control to a voltage source inverter, comprising the steps of:
   a) measuring at least one output voltage of the voltage source inverter;
   b) determining a first effective DC bus voltage signal based on the at least one output voltage and a modulation index of the voltage source inverter; and
   c) providing control based on the determined first effective DC bus voltage signal.

2. The method of claim 1, wherein the step of determining is performed by dividing the at least one output voltage by the modulation index.

3. The method of claim 1, further comprising the step of filtering the determined first effective DC bus voltage signal prior to the step of providing control.

4. The method of claim 3, wherein the step of filtering is performed using a low pass filter.

5. The method of claim 1, further comprising the step of compensating for effects of non-linear relationships between the modulation index, the at least one output voltage, and the first effective DC bus voltage.

6. A method for determining an effective DC voltage present within a voltage source inverter, comprising the steps of:
   determining at least a first output voltage of the voltage source inverter;
   determining at least a first output current of the voltage source inverter;
   estimating a power flow in the voltage source inverter based on the determined output voltage and current;
   integrating the estimated power flow;
   adding the integrated power flow to the estimated power flow to obtain an estimate of energy contained in the voltage source inverter; and
   dividing the estimate of stored energy by one-half of a nominal effective capacitance of the voltage source inverter and determining a square root of the divided stored energy to obtain an estimate of the effective DC bus voltage within the voltage source inverter.

7. The method of claim 6, further comprising the steps of determining a first effective voltage signal based on the at least a first output voltage of the voltage source inverter and a modulation index of the voltage source inverter, and filtering the estimated power flow through a filter having a lower filtering limit defined based on the first effective voltage signal prior to the step of integrating.

8. The method of claim 6, further comprising the step of: filtering the estimate of effective DC bus voltage through a filter having a lower filtering limit defined based on the at least a first output voltage and a modulation index of the voltage source inverter.

9. The method of claim 7, wherein the lower filtering limit is defined by $(CV^2)/2$, where C is the nominal effective capacitance and V is the at least a first output voltage.

10. The method of claim 6, wherein the step of estimating a power flow in the voltage source inverter is performed by multiplying the at least a first output voltage by the at least a first output current.

11. The method of claim 6, wherein the step of estimating a power flow in the voltage source inverter is performed by multiplying a first output voltage by a first output current and subtracting a product of a second output voltage and a second output current.

12. The method of claim 7, further comprising the step of compensating for effects of non-linear relationships between the modulation index, the first output voltage, and the estimated effective DC bus voltage.

13. An apparatus for providing control to a voltage source inverter, comprising:
   a plurality of connections to a corresponding plurality of outputs of the voltage source inverter;
   processing circuitry connected to receive at least a first output voltage from the plurality of connections, the processing circuitry determining a first effective DC bus voltage signal based on the at least a first output voltage and a modulation index of the voltage source inverter; and
   providing control based on the determined first effective DC bus voltage signal.

14. The apparatus of claim 13, wherein the processing circuitry determines the first effective DC bus voltage signal by dividing the at least a first output voltage by the modulation index.

15. The apparatus of claim 13, wherein the processing circuitry further filters the determined first effective DC bus voltage signal prior to providing control.

16. The apparatus of claim 15, wherein the processing circuitry performs the filtering using a low pass filter.

17. The apparatus of claim 15, wherein the processing circuitry further compensates for non-linear relationships between the modulation index, the first output voltage, and the first effective DC bus voltage.

18. An apparatus for providing control to a voltage source inverter, comprising:
   a plurality of connections to a corresponding plurality of outputs of the voltage source inverter; and
   processing circuitry connected to receive at least one output voltage and at least one output current of the voltage source inverter, the processing circuitry estimating a power flow in the voltage source inverter from the at least one output voltage and current, integrating the estimated power flow to obtain an estimate of energy contained in the voltage source inverter, dividing the estimate of stored energy by one-half of a nominal effective capacitance of the voltage source inverter, determining a square root of the divided stored energy to obtain an estimate of the effective DC bus voltage within the voltage source inverter, and providing control to the voltage source inverter based on the estimated effective DC bus voltage.

19. The apparatus of claim 18, wherein the processor further determines a first effective voltage signal based on one of the at least one output voltages of the voltage source inverter and a modulation index of the voltage source inverter, and filters, prior to performing the integration, the estimated power flow through a filter having a lower filtering limit defined based on the first effective voltage.

20. The apparatus of claim 18, wherein the processor further filters the estimate of effective DC bus voltage through a filter having a lower filtering limit defined based on the at least one output voltage and a modulation index of the voltage source inverter.

21. The apparatus of claim 19, wherein the lower filtering limit is defined by $(CV^2)/2$, where C is the nominal effective capacitance and V is one of the at least one output voltage.

22. The apparatus of claim 18, wherein the processor estimates a power flow in the voltage source inverter by multiplying the at least one output voltage by the at least one output current.

23. The apparatus of claim 18, wherein the processor estimates a power flow in the voltage source inverter by multiplying a first output voltage by a first output current and subtracting a product of a second output voltage and a second output current.

24. The apparatus of claim 19, wherein the processing circuitry further compensates for non-linear relationships between the modulation index, the first output voltage, and the first effective DC bus voltage.

25. A machine-readable storage medium for use in a general purpose processor, comprising:
   a) A machine-readable instruction for measuring at least one output voltage of a voltage source inverter;
   b) A machine-readable instruction for determining a first effective DC bus voltage signal based on the at least one output voltage and a modulation index of the voltage source inverter; and
   c) A machine-readable instruction for providing control based on the determined first effective DC bus voltage signal.

26. The medium of claim 25, wherein the instructions for determining include dividing the at least one output voltage by the modulation index.

27. The medium of claim 25, further comprising machine-readable instructions for filtering the determined first effective DC bus voltage signal prior to providing control.

28. The medium of claim 27, wherein the filtering is performed using a low pass filter.

29. The method of claim 25, further comprising machine-readable instructions for compensating for effects of non-linear relationships between the modulation index, the at least one output voltage, and the first effective DC bus voltage signal.

30. A machine-readable storage medium for use in a general-purpose processor, comprising:
   a machine readable instruction for determining at least a first output voltage of a voltage source inverter;
   a machine-readable instruction for determining at least a first output current of the voltage source inverter;
   a machine-readable instruction for estimating a power flow in the voltage source inverter based on the determined output voltage and current;
   a machine-readable instruction for integrating the estimated power flow;
   a machine-readable instruction for adding the integrated power flow to the estimated power flow to obtain an estimate of energy contained in the voltage source inverter; and
   a machine-readable instruction for dividing the estimate of stored energy by one-half of a nominal effective capacitance of the voltage source inverter and determining a square root of the divided stored energy to obtain an estimate of the effective DC bus voltage within the voltage source inverter.

31. The medium of claim 30, further comprising: machine-readable instruction for determining a first effective voltage signal based on the at least a first output voltage of the voltage source inverter and a modulation index of the voltage source inverter, and filtering the estimated power flow through a filter having a lower filtering limit defined based on the first effective voltage signal prior to the step of integrating.

32. The medium of claim 30, further comprising machine-readable instruction for filtering the estimate of effective DC bus voltage through a filter having a lower filtering limit defined based on the at least a first output voltage and a modulation index of the voltage source inverter.

33. The medium of claim 31, wherein the lower filtering limit is defined by $(CV^2)/2$, where C is the nominal effective capacitance and V is the at least a first output voltage.

34. The medium of claim 6, wherein the instruction for estimating a power flow in the voltage source inverter is performed by multiplying the at least a first output voltage by the at least a first output current.

35. The method of claim 6, wherein the instruction for estimating a power flow in the voltage source inverter is performed by multiplying a first output voltage by a first output current and subtracting a product of a second output voltage and a second output current.

* * * * *